United States Patent
VanZante et al.

(10) Patent No.: US 7,636,828 B2
(45) Date of Patent: Dec. 22, 2009

(54) METHOD FOR AUTOMATIC ADJUSTMENT OF TIMING OF DOUBLE DATA RATE INTERFACE

(75) Inventors: Craig VanZante, Roseville, CA (US); King Wayne Luk, Elk Grove, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 589 days.

(21) Appl. No.: 11/590,116

(22) Filed: Oct. 31, 2006

(65) Prior Publication Data

US 2008/0104351 A1  May 1, 2008

(51) Int. Cl.
*G06F 12/00* (2006.01)

(52) U.S. Cl. ............... 711/167; 711/104; 711/105; 711/168; 711/100; 711/111; 711/112; 365/230.03; 365/233.1; 365/233.13; 710/22; 710/25; 710/33; 710/34; 710/35; 710/58; 710/59; 710/60; 710/61

(58) Field of Classification Search ........... 711/100, 711/104–105, 111–112, 167–168; 365/189.011, 365/189.04, 189.14, 189.17, 193, 220–221, 365/230.03, 233.1, 233.13; 710/22, 25, 33–35, 710/58–61

See application file for complete search history.

(56) References Cited

U.S. PATENT DOCUMENTS

| | | | | |
|---|---|---|---|---|
| 6,493,285 B1* | 12/2002 | Wolford | ............... | 365/185.17 |
| 6,664,838 B1* | 12/2003 | Talledo | ............... | 327/277 |
| 6,889,334 B1* | 5/2005 | Magro et al. | ............... | 713/500 |
| 6,940,768 B2* | 9/2005 | Dahlberg et al. | ............... | 365/201 |
| 7,127,584 B1* | 10/2006 | Thompson et al. | ............... | 711/169 |
| 2005/0057978 A1* | 3/2005 | Stubbs | ............... | 365/194 |
| 2005/0141331 A1* | 6/2005 | Cho | ............... | 365/233 |
| 2008/0104351 A1* | 5/2008 | VanZante et al. | ............... | 711/167 |

* cited by examiner

*Primary Examiner*—Tuan V Thai
*Assistant Examiner*—Zhou H Li (57) ABSTRACT

Timing of a write and read strobes for a memory having a double data rate (DDR) interface are automatically adjusted using write-read operations. A first and a second value of the write and read strobes are determined for a first write-read operation having the read data match the write data. A second write-read operation is performed for each of a plurality of third values for the write strobe at the second value for the read strobe set. A center of the third values having the read data match the write data is determined. A third write-read operation is performed for each of a plurality of fifth values for the read strobe at the fourth value of the write strobe. A center of the fifth values having the read data match the write data is determined. The timing of the write and read strobes are set to the centers.

22 Claims, 7 Drawing Sheets

METHOD FOR AUTOMATIC ADJUSTMENT OF TIMING OF DOUBLE DATA RATE INTERFACE

FIELD OF THE INVENTION

The present disclosure generally relates to automatic adjustment of the timing parameters of a memory interface.

BACKGROUND

A computing system may include a memory for storing instructions and variables of software executing on the computing system. Access to data stored in a memory may be provided via a memory interface, such as a double data rate (DDR) interface. Providing high performance for the software executing on the computer system may require that data is transferred through the memory interface at a high bandwidth, and providing high bandwidth may require that the data is transferred through the memory interface at a high data rate. For a DDR interface, a high data rate is provided in part by transferring the data at rate that is twice the rate of control signals, such as the addressing signals of the memory.

For a high data rate, data being transferred through the DDR interface may be valid for a brief period of time. To successfully transfer the data from a source through the DDR interface to a destination, the data may need to be sampled at the destination during the brief period of time in which the data is valid at the destination. For a read from memory, the source may be the memory and the destination may be a memory controller for a processor of the computing system, and for a write to memory, the source may be a memory controller and the destination may be the memory.

Precise control of the write timing for writing data to the memory and precise control of the read timing for reading data from memory may be necessary to transfer data to and from the memory at a high data rate. Various factors may affect the write timing and the read timing, for example, fluctuations in fabrication processes used to manufacture the memory and memory controller, variations in the printed circuit board or boards connecting the memory controller with the memory, variations in the voltages of the power supply or supplies of the memory controller and the memory, and variations in temperature including variations in the ambient temperature of the computing system. These process, voltage, and temperature variations may cause a particular setting of write and read timings, which is functional for one combination of process, voltage, and temperature, to fail for another combination of process, voltage, and temperature.

SUMMARY

A method is provided for automatic adjustment of a timing of a write and read strobes of a memory having a double data rate (DDR) interface using write-read operations. Each write-read operation includes writing write data to a location in the memory via the DDR interface with the timing of the write strobe set a value and subsequently reading read data from the location with the timing of the read strobe set to a value. A first value of the write strobe and a second value for the read strobe are determined for a first write-read operation having the read data match the write data. A respective second write-read operation is performed for each of a plurality of third values for the write strobe at the second value for the read strobe set. A fourth value is determined that is a center of the third values for which the respective second write-read operation has the read data match the write data. A respective third write-read operation is performed for each of a plurality of fifth values for the read strobe at the fourth value of the write strobe. A sixth value is determined that is a center of the fifth values for which the respective third write-read operation has the read data match the write data. The timing of the write strobe is set to the fourth value and the timing of the read strobe is set to the sixth value.

It will be appreciated that various other embodiments are set forth in the Detailed Description and Claims which follow.

DETAILED DESCRIPTION

Figure 1:
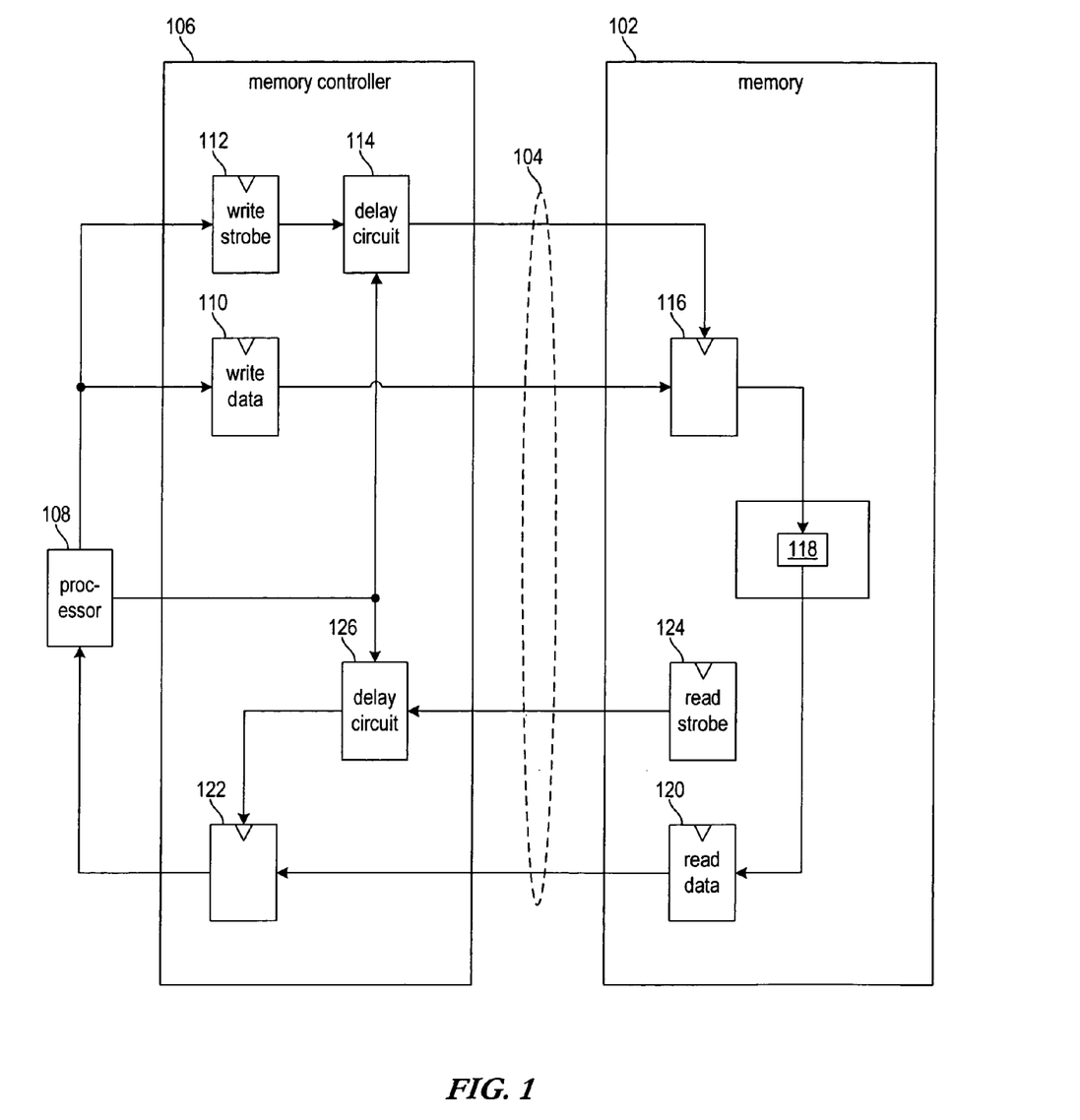
FIG. 1 is a block diagram of an apparatus for automatic adjustment of write and read timings for a memory in accordance with various embodiments of the invention.

FIG. 1 is a block diagram of an apparatus for automatic adjustment of write and read timings for a memory 102 in accordance with various embodiments of the invention. A double date rate (DDR) interface 104 may connect the memory 102 with a memory controller 106. The processor 108 may check for proper operation of the memory 102 at various combinations of the available write and read timings, and a combination providing proper operation may be selected as an operating point for the write and read timings. It will be appreciated that the processor 108 controlling the memory controller may be internal to the memory controller.

Data may be written from the memory controller 106 to the memory 102 via the DDR interface 104 by loading the write data into register 110 and indicating the presence of the write data by writing a strobe value into register 112. Write delay circuit 114 may forward the strobe value from register 112 to the DDR interface 104 after an adjustable delay that may be set by processor 108. The memory 102 receives the write data from register 110 and stores the write data into register 116 as controlled by the delayed write strobe from write delay circuit 114. The memory 102 may transfer the write data from the register 116 into a location 118 in the memory 102 that is selected by addressing logic (not shown).

Data may be read from a location 118 in the memory 102 by transferring the read data from the location 118 to register 120 and from register 120 via the DDR interface 104 to register 122 of the memory controller 106. The memory 102 may indicate the presence of the read data in register 120 by writing a strobe value into register 124. Read delay circuit 126 may forward the strobe value from DDR interface 104 to register 122 after an adjustable delay that may be set by processor 108. Register 122 may store the read data from register 120 as controlled by the delayed read strobe from read delay circuit 126.

Delay circuits 114 and 126 may each have parameters that set the amount of the strobe delay that is generated. The processor 108 may adjust the write timing of the DDR interface 104 by setting the value of the parameter for the strobe delay of write delay circuit 114. The processor 108 may similarly adjust the read timing by setting the strobe delay for read delay circuit 126. It will be appreciated that instead of positioning the delay circuits 114 and 126 within the memory controller 106 as shown, one or both of the delay circuits may be positioned within the memory 102.

Figure 2:
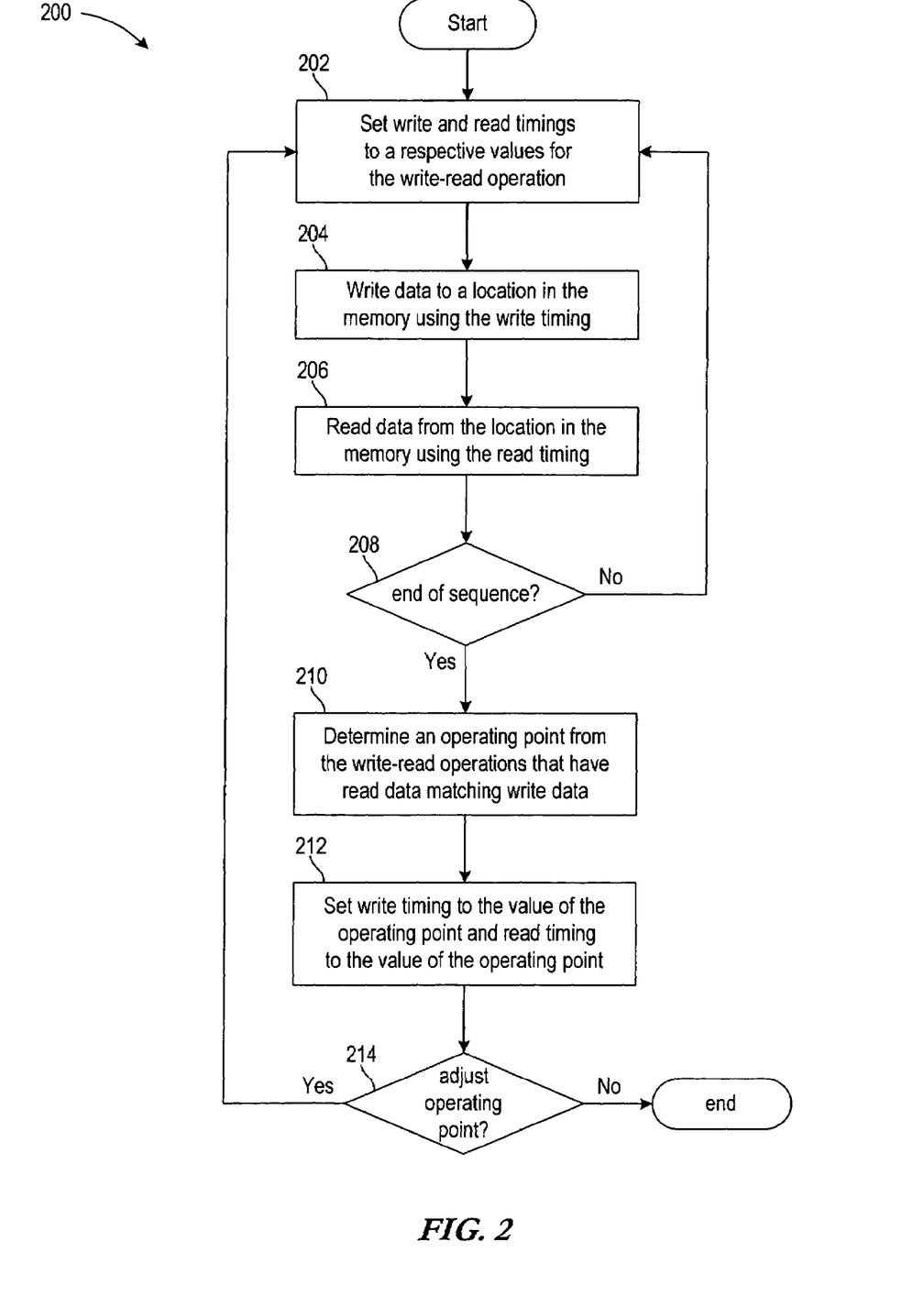
FIG. 2 is a flow diagram of a process for automatic adjustment of a write timing and a read timing for a memory in accordance with various embodiments of the invention.

FIG. 2 is a flow diagram of a process 200 for automatic adjustment of a write timing and a read timing for a memory in accordance with various embodiments of the invention. A sequence of operations is performed with each operation in the sequence writing data to a location in the memory and subsequently reading the data back from the location in the memory. For each operation in the sequence, the read data returned from the memory is compared with the write data written to the memory to determine whether the write data was successfully written to the memory and the read data was successfully read from the memory. If the read data returned from the memory is different from the write data written to the memory, then one or both of the writing of the write data and the reading of the read data was unsuccessful. By performing each operation of the sequence at a different combination of the write timing and the read timing, an operating point may be determined.

At step 202, the write timing and the read timing are set to respective values for a write-read operation of a sequence of write-read operations. At step 204, write data is written to a location in the memory using the write timing, and at step 206 read data is read from the location in the memory using the read timing. Decision 208 checks whether the sequence of read and write timings is complete. Process 200 returns to step 202 when the sequence has more combinations of read and write timings; otherwise, process 200 proceeds to step 210. In one embodiment, the sequence includes all combinations of every possible write timing and every possible read timing.

At step 210, an operating point is determined from the write-read operations that have the read data matching the write data. Frequently, the operating point is set at a center of the write and read timings for the write-read operations that have the read data match the write data. At step 212, the write timing and the read timing are set to respective values from the operating point. Decision 214 checks whether further adjustment of the operating point is needed. For further adjustment of the operating point, process 200 returns to step 202. In certain embodiments, the operating point is continuously, periodically, or sporadically adjusted during the operation of the DDR interface.

Figure 3:
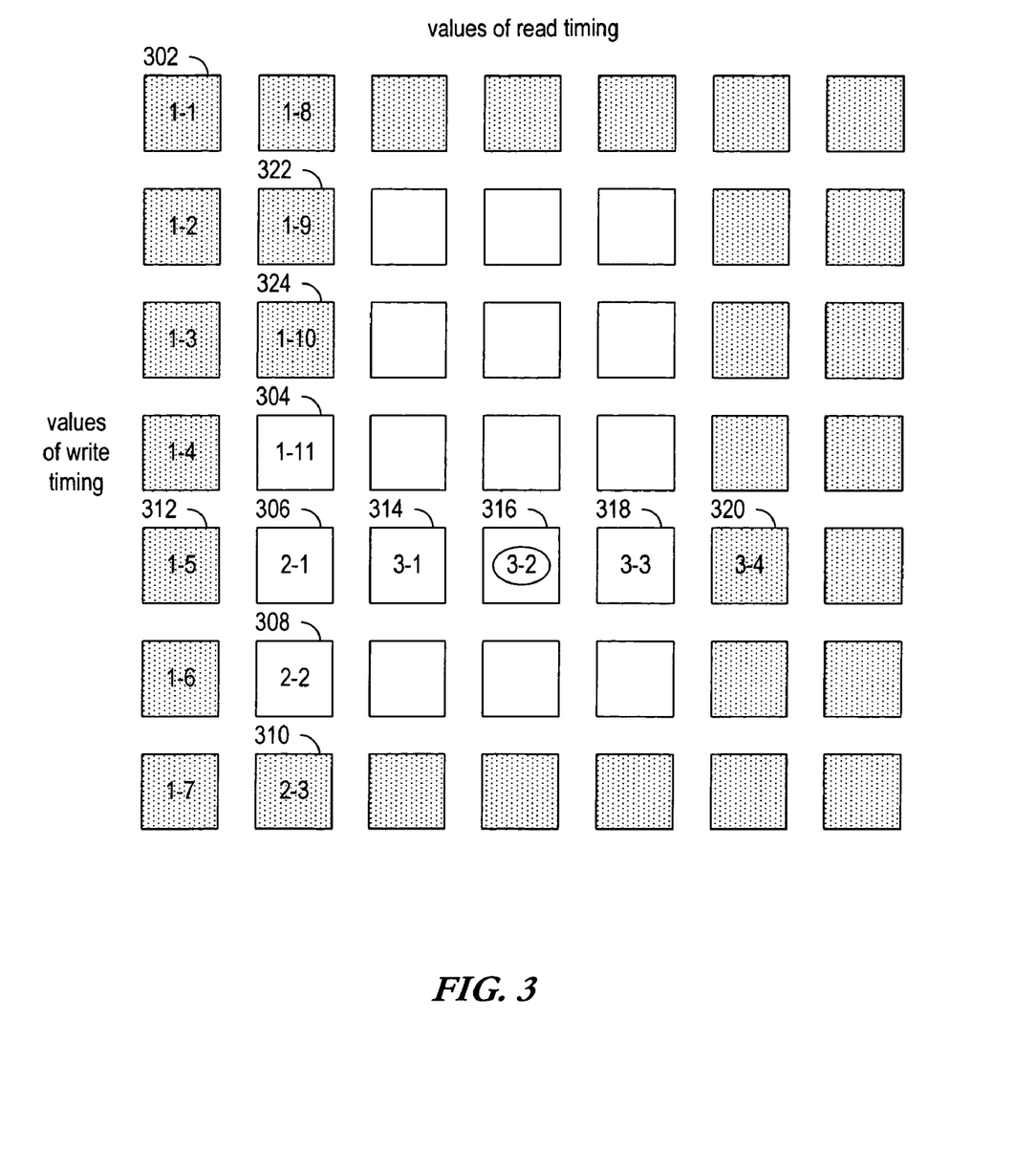
FIGS. 3 and 4 are example operating diagrams illustrating selection of an operating point for a DDR interface of a memory in accordance with various embodiments of the invention.

FIG. 3 is an example operating diagram illustrating selection of an operating point for a DDR interface of a memory in accordance with various embodiments of the invention. An operating point may be selected by testing the success of write-read operations at various combinations of values for the read timing and the write timing. The columns correspond to various values of the read timing, the rows correspond to various values of the write timing, and the blocks represent different combinations of the read timing and write timing values. While the selection of an operating point might not check all combinations of the read and write timings, the combinations, such as combination 302, that have or would have an unsuccessful write-read operation are shown shaded in the example of FIG. 3.

An operating point may be selected using a sequence of write-read operations at various combinations of the write and read timing, and certain of the combinations of the example of FIG. 3 are labeled to identify the order in the sequence according to one embodiment of the invention. The sequence of write-read operations may have three phases in one embodiment of the invention, and the labels of the combinations of the example FIG. 3 have a format N-M with N indicating the phase and M indicating the step within the phase.

During the first phase, write-read operations are tested until a successful combination of write and read timings is determined that has the read data match the write data. For the example of FIG. 3, the first phase begins at unsuccessful combination 302 and ends at successful combination 304. During the second phase, write-read operations are tested to determine a range of successful combinations having the read timing fixed at the read timing of the successful combination of the first phase. For the example of FIG. 3, the second phase first checks successful combinations 306 and 308 and then ends at unsuccessful combination 310. A center combination 306 may be determined from the range of successful combinations 304, 306, and 308. During the third phase, write-read operations are tested to determine a range of successful combinations having the write timing fixed at the write timing of the center combination from the second phase. For the example of FIG. 3, the third phase first checks unsuccessful combination 312, continues checking successful combinations 314, 316, and 318, and then ends at unsuccessful combination 320. Another center combination 316 may be determined from the range of successful combinations 306, 314, 316, and 318. The center combination 316 from the third phase may be selected as the operating point for the DDR interface.

When the DDR interface is operating properly at particular values for the read and write timings, the read data should match the write data. When the read data does not match the write data, the writing of the write data may be unsuccessful and/or the reading of the read data may be unsuccessful. Because an unsuccessful writing of the write data may result in corrupted data being written to the location in the memory, the read data generally does not match the write data for a write-read operation with an unsuccessful writing of the write data, regardless of the success or failure of reading the read data. Thus, the success or failure of reading the read data is not generally determinable for a write-read operation having an unsuccessful writing of the write data.

The write timing may be considered of higher importance that the read timing for a write-read operation because a read timing that produces a successful reading of the read data might not be determinable until a write timing is determined that produces a successful writing of the write data. Thus, the first phase of one embodiment of the invention may systematically check all values of the write timing for each value of the read timing until a write timing is found that results in a successful write-read operation having the read data match the write data. For the example of FIG. 3, the first phase of write-read operations may begin at combination 302 having a smallest value for a parameter specifying the write timing and a smallest value for another parameter specifying the read timing. All possible values of the write timing may be considered at this smallest value for the read timing without finding a successful write-read operation. The first phase may continue to search for a successful write-read operation at the next larger value of the read timing. It will be appreciated that the combinations of write and read timing may be searched by first searching combinations having a fixed value for the write timing instead of a fixed value for the read timing. In addition, the checking of combinations may begin with largest values of the write and read timings or with values in the middle of the ranges of possible values for the write and read timings.

Frequently, the writing of write data and the reading of read data of a write-read operation are mostly independent. If the writing of write data and the reading of read data of a write-read operation are truly independent, the combinations of write and read timings having a successful write-read operation may be a rectangular region or regions within all of the combinations. For the example of FIG. 3, the successful combinations would be a rectangular region if the combinations 322 and 324 were successful combinations instead of unsuccessful combinations. Thus, FIG. 3 illustrates an example having some dependence between the writing of the write data and the reading of the read data. For example, the writing of the write data may generate electrical noise that persists to adversely affect the subsequent reading of the read data. Various embodiments of the invention quickly determine an operating point within the successful combinations of write and read timings when the successful combinations form a rectangular region or an approximately rectangular region.

Figure 4:
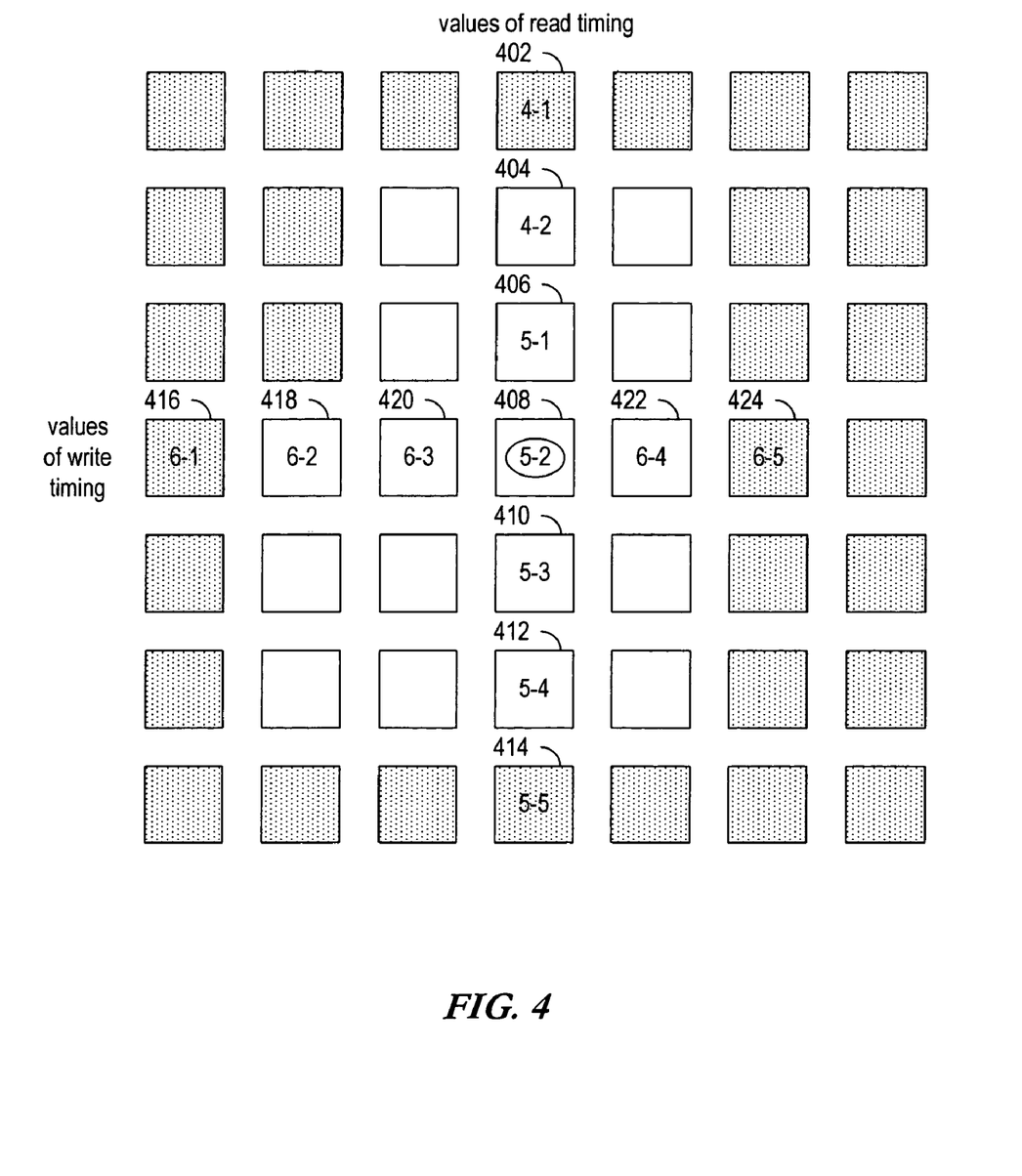

FIG. 4 is an example operating diagram illustrating selection of an operating point beginning from the operating point 316 of FIG. 3. In certain embodiments of the invention, the determination of an operating point may be repeated continuously, occasionally, or intermittently. Repeating the determination of an operating point may be useful to determine a better operating point when the successful combinations of the write and read timings form regions that are not rectangular. Similar to FIG. 3, the combinations that are shaded would have an unsuccessful write-read operation, and certain combinations are labeled to identify an order in a sequence of write-read operations according to one embodiment of the invention.

Following the three phases of the sequence illustrated in FIG. 3, FIG. 4 illustrates three similar additional phases, denoted the fourth, fifth, and sixth phases of the sequence according to one embodiment of the invention. The fourth phase checks combinations having the read timing fixed at the read timing of the previous operating point until a successful combination is found. For the example of FIG. 4, the fourth phase may include testing the unsuccessful combination 402 and the successful combination 404. The fifth phase continues checking combinations having the read timing fixed at the read timing of the previous operating point until a subsequent unsuccessful combination is found. For the example of FIG. 4, the successful combinations 406 through 412 and the unsuccessful combination 414 are checked. A center combination 408 is determined within the range of successful combinations 404 through 412 at the read timing of the previous operating point. The sixth phase checks combinations having the write timing fixed at the write timing of the center combination from the fifth phase to find a range of successful combinations. For the example of FIG. 4, the sixth phase checks unsuccessful combination 416, successful combinations 418, 420, and 422, and unsuccessful combination 424. Successful combination 408 was previously checked during the fifth phase and is optionally checked again during the sixth phase. The operating point may be set to the center combination 408 of the successful combinations 418, 420, 408, and 422. The operating point 408 of FIG. 4 may be an improved operating point over the operating point 316 of FIG. 3.

In various embodiments of the invention, the sequence of write-read operations at various combinations of the write and read timings may include repeated write-read operations at a particular combination of the write and read timings that has the read data not match the write data. Repeating a write-read operation at a particular unsuccessful combination may confirm that the read data persistently does not match the write data. For an unsuccessful combination, the sequence may include a limited number of repeated write-read operations writing write data to a location in the memory and reading read data from the location in the memory. These repeated write-read operations may complete when either the limit is reached or the read data matches the write data for one of the repeated write-read operations. Combinations of the write and read timings having the read data match and also not match the write data for various write-read operations may be classified as either successful or unsuccessful combinations.

In one embodiment of the invention, the write data and/or the location in the memory may vary for each write-read operation of the sequence. For an unsuccessful writing of write data to a location in memory, the location in the memory might retain the previous value. If the previous value is the same as the write data, a subsequent reading of the location in the memory may be unable to distinguish between the success and failure of the writing of the write data. The write data may be varied for each write-read operation, for example, by including a count field that is incremented for each write-read operation. The write data may also include a test pattern field or fields, such as alternating bits of zero and one values, which are more likely to cause failures or more likely to enable the detection of failures.

Figure 5:
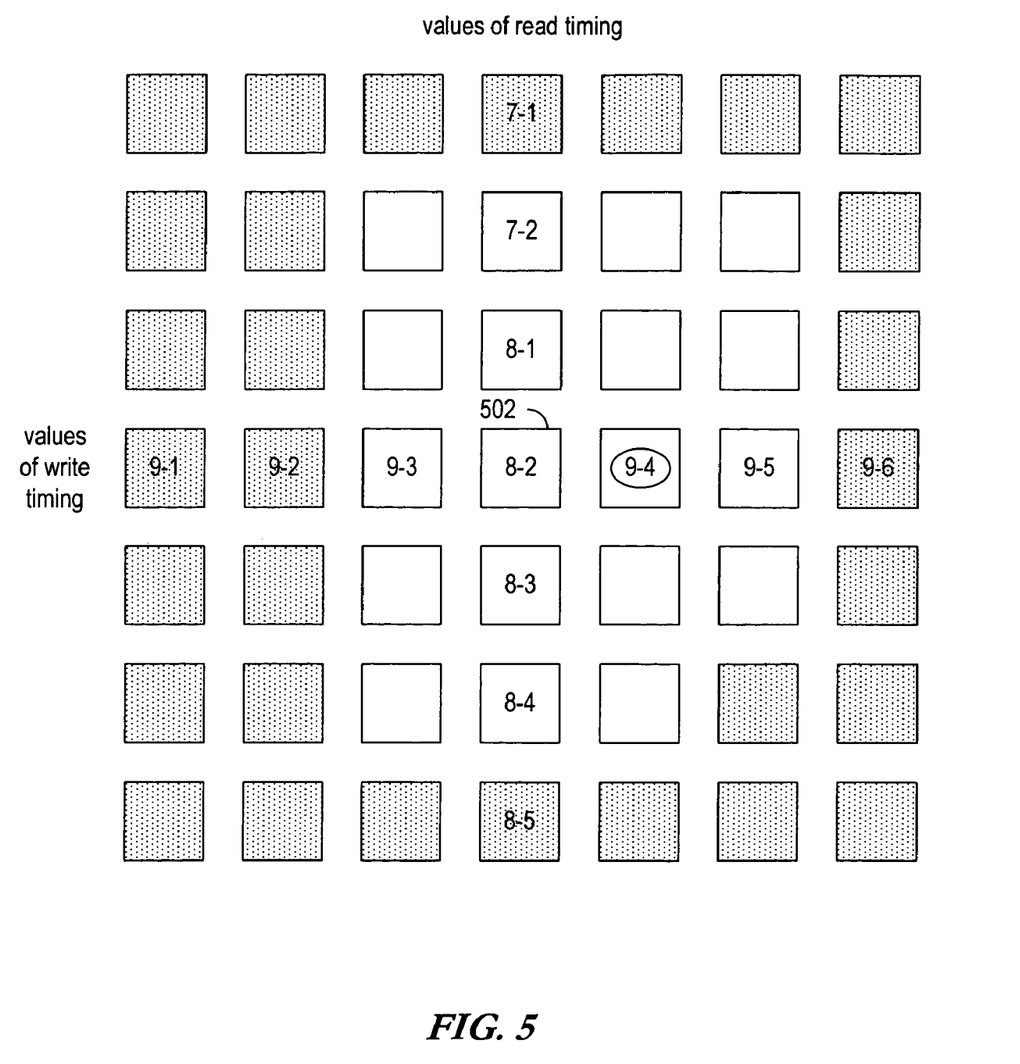
FIG. 5 is an example operating diagram illustrating selection of an operating point following a change in operating conditions in accordance with various embodiments of the invention.

FIG. 5 is an example operating diagram illustrating selection of an operating point following a change in operating conditions in accordance with various embodiments of the invention. A change in operating conditions, such as a change in the ambient temperature or a change in the voltage of a power supply or supplies, may affect the writing of write data and/or the reading of read data. For example, the change in operating conditions may shift the success and failure of combinations of the read and write timings shown in FIG. 4 to that shown in FIG. 5. Because of this shift induced by the change in operating conditions, a new operating point may be selected. In one embodiment, the operation conditions are monitored and a monitored change in operation conditions may trigger the selection of a new operating point. Similar to FIG. 3 and FIG. 4, the combinations of write and read timings that would result in an unsuccessful write-read operation are shown shaded in FIG. 5, and certain combination are labeled with an identification of phase and step of a sequence of write-read operations.

An iteration of the selection of the operating point following the change in operating conditions may have three phases that are similar to the three phases discussed in connection with FIG. 3 and the three phases discussed in connection with FIG. 4. A new operating point 502 may be selected. It will be appreciated that a phase may include scanning of values of the write timing at a fixed read timing or vice versa, and the scanning for a phase may include a downward scan of decreasing values beginning at the preceding operating point and an upward scan of increasing values beginning again at the preceding operation point. The downward and upward scans may terminate when the read data no longer matches the write data.

In certain embodiments of the invention, the operating point is selected as a center of a largest window having successful write-read operations. In one embodiment, the parameter controlling the write timing may have approximately 100 values and the parameter controlling the read timing may also have approximately 100 values, yielding approximately 10,000 combinations of write and read timings. Certain embodiments of the invention check a small subset of the combinations of write and read timings, and a range of successful combinations of the write timing at a fixed read timing may be ignored when the number of combinations in the range is under a threshold, for example, less than a threshold of 10 values of the 100 possible values for the write timing. Such small ranges may occur along an edge of a region of successful combinations, and ignoring these small ranges may result in determining an improved operating point.

Within the contiguous region or regions of successful combinations of the write and read timings, a largest window is determined and a center of the largest window is selected as the operating point. The largest window may be a contiguous region of successful combinations having the largest number of successful combinations, a contiguous region of successful combinations having the largest sum of its width and height, a contiguous region of successful combinations having the largest minimum of its width and height, or the largest window according to another measure, such as a largest rectangular window within a contiguous region of successful combinations.

Because the operating point may be re-determined to compensate for changes in operating conditions during the operation of the DDR interface of the memory, a wider range of operating conditions, such as a wider range of operating temperatures, may be supported. In addition, higher reliability may be achieved because centering the operating point may provide additional margin to offset against short-term transient changes in operating conditions, such as a drop on the voltage of a power supply.

Figure 6:
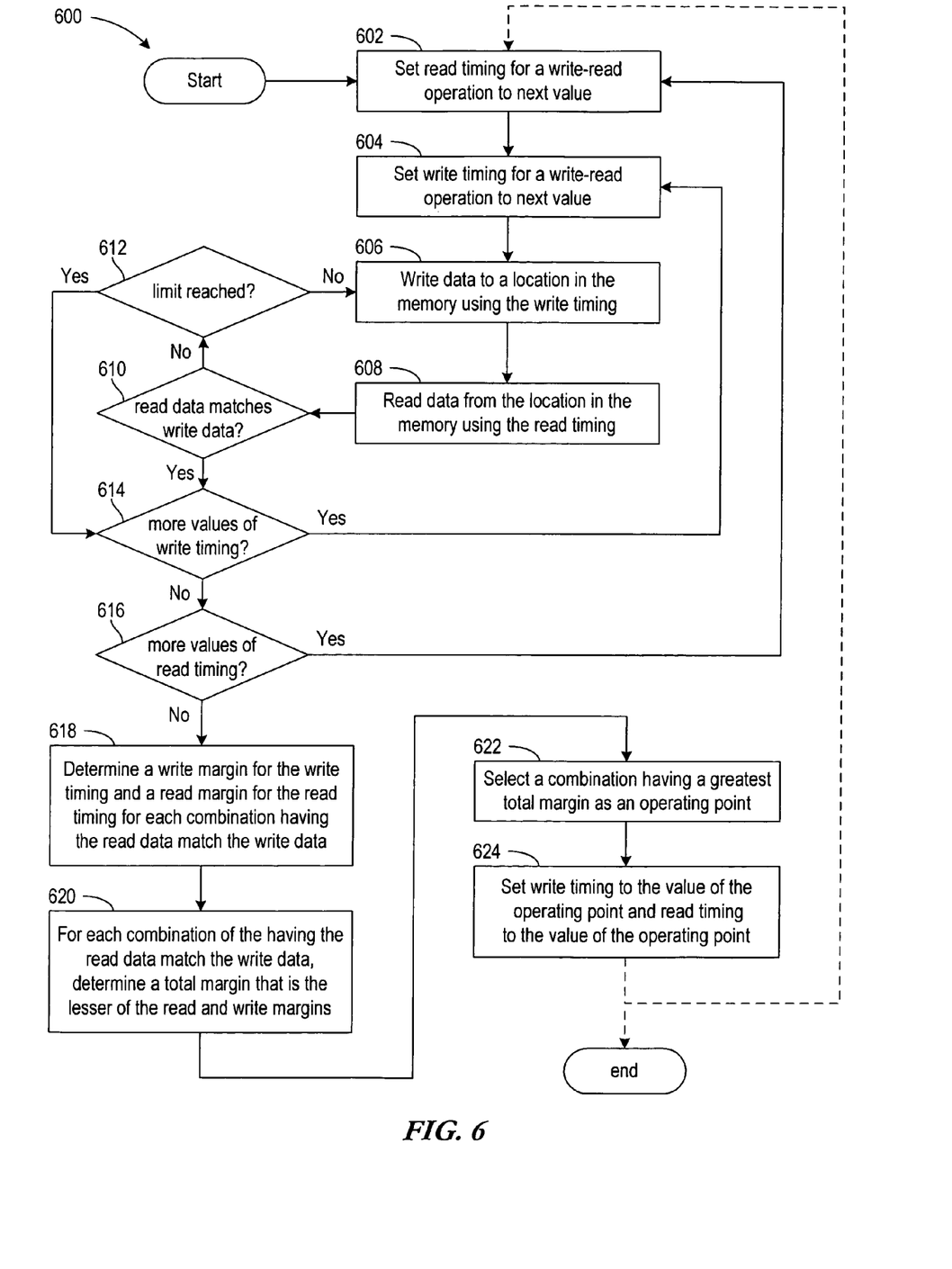
FIG. 6 is a flow diagram of a process for selecting an operating point of a memory in accordance with various embodiments of the invention.

FIG. 6 is a flow diagram of a process for selecting an operating point of a memory in accordance with various embodiments of the invention. A sequence of write-read operations exhaustively checks all possible combinations of values for the write timing and the read timing, and the operating point is selected within the combinations for which the read data matches the write data for the write-read operations of the sequence.

At step 602, the read timing is set and the value for the read timing may determine a delay between data read from the memory and a strobe indicating the presence of the data on a DDR interface of the memory. At step 604, the write timing is set and the value for the write timing may determine a delay between the data written to the memory and a strobe indicating the presence of the data on a DDR interface of the memory. Data is written to a location in the memory using the write timing at step 606, and data is read from the location in the memory using the read timing at step 608.

Decision 610 checks whether the data read at step 608 matches the data written at step 606. Process 600 proceeds to decision 612 for an unsuccessful write-read operation having non-matching data, and process 600 proceeds to decision 614 for a successful write-read operation having matching data. Decision 612 checks whether a limit has been reached for repeating an unsuccessful write-read operation a particular combination of the values for the write and read timings. Process 600 returns to step 606 when the limit has not been reached and process 600 proceeds to decision 614 when the limit is reached.

Decision 614 checks whether the write timing has additional values and when the write timing has additional values process 600 returns to step 604 to set the next value of the write timing. The next value of the write timing may be an increased or decreased value of the write timing. When the write timing does not have additional values, process 600 proceeds to step 616 and the available values of the write timing are reset. Decision 616 checks whether the read timing has additional values and when the read timing has additional values process 600 returns to step 602 to set the next value of the read timing, which may be an increased or decreased value of the read timing; otherwise process 600 proceeds to step 618.

For each successful write-read operation having the read data match the write data, dimensions are determined at step 618 for a window centered on the successful write-read operation. The dimensions of the window are the write margin and the read margin. The write margin indicates the magnitude of the range of increases and decreases of the write timing that still have a successful write-read operation. Generally, the write margin is the smaller of the amount of increase and the amount of decrease that can be tolerated while still having a successful write-read operation. The read margin for the window centered on the successful write-read operation is similarly determined.

At step 620, the write and read margins for each successful write-read operation are converted into a single measure of the total margin for each successful write-read operation. In one embodiment, the total margin is the lesser of the write margin and the read margin. Alternatively, the total margin may be a sum or product of the write margin and the read margin.

At step 622, the total margins for the successful write-read operations are compared and a maximum value of the total margins is determined. At step 624, the operating point is set to the write and read timing of the combination for the successful write-read operation that has this maximum value, thereby setting the write and read timing to the center of a largest window of the successful write-read operations. When multiple combinations correspond to this maximum value, one of the combinations is selected and the operating point is set to the write and read timing of the combination. In certain embodiments, process 600 iterates by returning to step 602.

Figure 7:
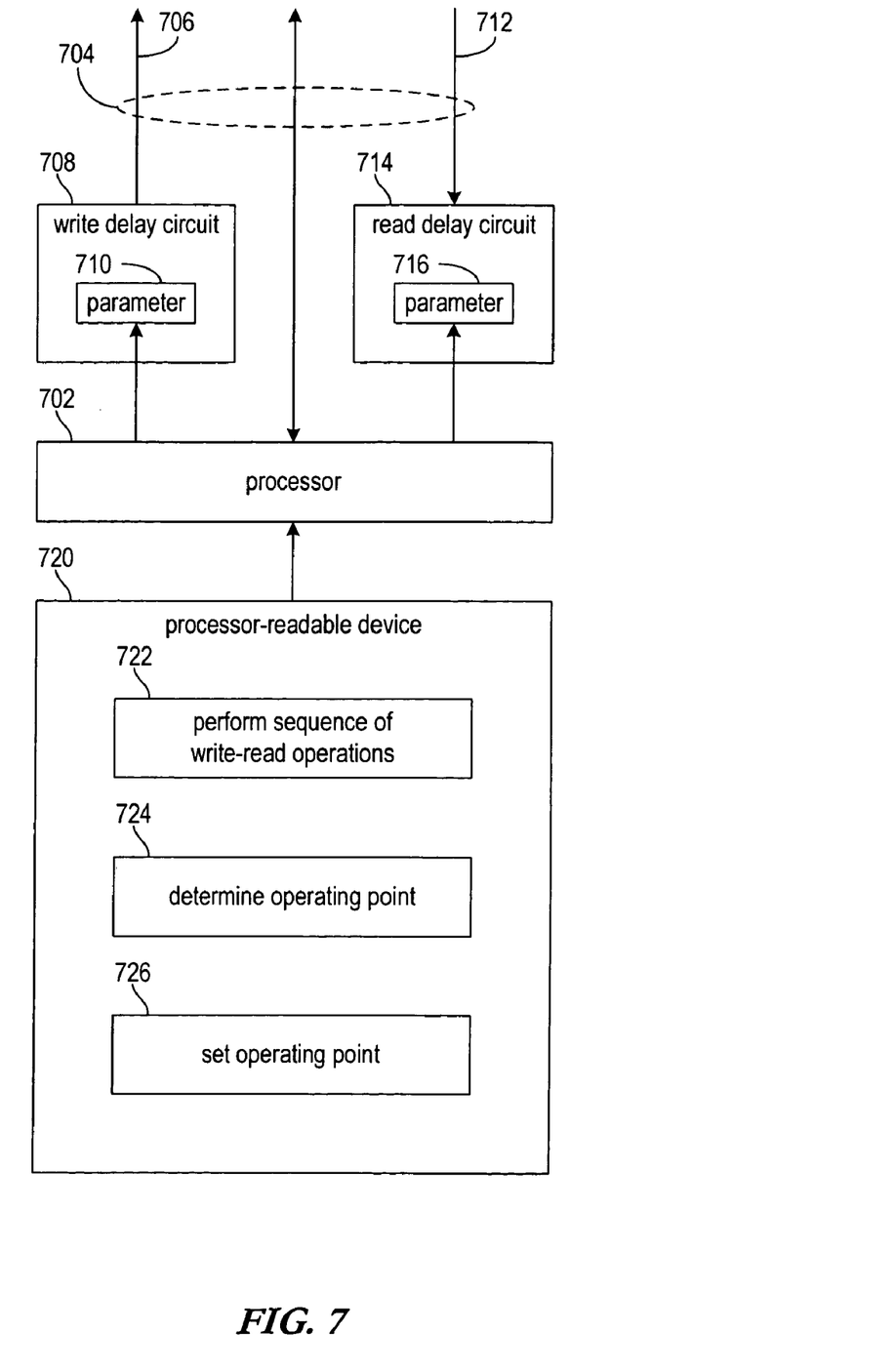
FIG. 7 is a block diagram of a system for adjustment of write timing and read timing by a processor in accordance with various embodiments of the invention.

FIG. 7 is a block diagram of a system for adjustment of write timing and read timing by a processor 702 in accordance with various embodiments of the invention. A DDR interface 704 transfers data to and from a memory (not shown). The presence of data being written by the processor 702 to the memory is indicated by a write strobe on line 706 of the DDR interface 704. A write delay circuit 708 generates the write strobe on line 706 after a variable delay that is adjusted by processor 702 setting parameter 710. The presence of data being read from the memory by the processor 702 is indicated by a read strobe on line 712 of the DDR interface 704. A read delay circuit 714 delays the read strobe on line 712 by a variable delay that is adjusted by processor 702 setting parameter 716. It will be appreciated that a write delay circuit may delay the write data instead of the write strobe and a read delay circuit may similarly delay the read data instead of the read strobe.

The processor 702 may execute instructions from the program storage medium of processor-readable device 720. The processor-readable device 720 may be configured with instructions for automatic adjustment of write and read timings of a double data rate (DDR) interface of a memory. The instructions of processor-readable device 720 may include software modules 722, 724, and 726. Software module 722 may perform a sequence of write-read operations, each write-read operation of the sequence including setting the write timing and the read timing to respective values from ranges of possible values, and writing write data to a location in the memory using the write timing and subsequently reading read data from the location in the memory using the read timing.

Software module 724 may determining an operating point from the write-read operations for which the read data matches the write data, and software module 726 may set the write and read timings to the values of the operating point.

Those skilled in the art will appreciate that various alternative computing arrangements would be suitable for hosting the processes of the different embodiments of the present invention. For example, the processes may be implemented on single processor, multi-processor, parallel processor, or an arrangement of processors on a local area network. In addition, the processes may be provided via a variety of computer-readable media or delivery channels such as magnetic or optical disks or tapes, electronic storage devices, or as application services over a network.

The present invention is believed to be applicable to a variety of memories and has been found to be particularly applicable and beneficial in adjusting the timing of a DDR interface of a memory. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A processor-implemented method for automatic adjustment of timing of a write and read strobes of a memory having a double data rate (DDR) interface, the processor-implemented method comprising:

performing sequentially a plurality of respective write-read operations for all combinations of a first plurality of values for the timing of the write strobe and a second plurality of values for the timing of the read strobe, each write-read operation of the sequence including writing write data to a location in the memory via the DDR interface with the timing of the write strobe set to one of the first plurality of values and subsequently reading read data from the location in the memory via the DDR interface with the timing of the read strobe set to one of the second plurality of values;

determining a first range of the first plurality of values and a second range of the second plurality of values for which each combination of a value in the first range and a value in the second range has the read data match the write data for the respective write-read operation for the combination, wherein a largest possible value is obtained for a lesser of a magnitude of the first range and a magnitude of the second range; and setting the timing of the write strobe to a center of the first range and setting the timing of the read strobe to a center of the second range.

2. The processor-implemented method of claim 1, further comprising iteratively repeating, during operation of the DDR interface of the memory, the performing of the write-read operations, the determining of the first and second ranges, and the setting of the timing of the write strobe and the setting of the timing of the read strobe.

3. A processor-implemented method for automatic adjustment of a timing of a write and read strobes of a memory having a double data rate (DDR) interface, the processor-implemented method comprising:

determining a first and a second value for which a first write-read operation has read data match write data, wherein the first write-read operation includes writing the write data to a location in the memory via the DDR interface with the timing of the write strobe set to the first value and subsequently reading the read data from the location in the memory via the DDR interface with the timing of the read strobe set to the second value;

for each of a plurality of third values, performing a respective second write-read operation including writing write data to a location in the memory with the timing of the write strobe set to the third value and subsequently reading read data from the location in the memory with the timing of the read strobe set to the second value;

determining a fourth value that is a center of the plurality of third values for which the respective second write-read operation has the read data match the write data;

for each of a plurality of fifth values, performing a respective third write-read operation including writing write data to a location in the memory with the timing of the write strobe set to the fourth value and subsequently reading read data from the location in the memory with the timing of the read strobe set to the fifth value;

determining a sixth value that is a center of the plurality of fifth values for which the respective third write-read operation has the read data match the write data; and setting the timing of the write strobe to the fourth value and the timing of the read strobe to the sixth value.

4. The processor-implemented method of claim 3, further comprising iteratively repeating, during operation of the DDR interface of the memory, the performing of the respective second write-read operation for each of the third values, the determining of the fourth value, the performing of the respective third write-read operation for each of the fifth values, the determining of the sixth value, and the setting of the timing of the write strobe and the timing of the read strobe, wherein for each iteration of the repeating, the first and second values for the iteration respectively are the fourth and sixth values of a preceding iteration of the repeating.

5. The processor-implemented method of claim 3, wherein the determining of the first and second values includes performing a sequence of at least one write-read operation culminating with the first write-read operation having the read data match the write data, the sequence using coordinated values of the timing of the write and read strobes for each write-read operation of the sequence, the first and second values of the timing of the write and read strobes being the coordinated values of the first write-read operation that culminates the sequence.

6. The processor-implemented method of claim 5, wherein the sequence uses the coordinated values of the timing of the write strobe and the timing of the read strobe that, until the read data matches the write data, sweep the coordinated value of the timing of the read strobe from a minimum value to a maximum value and, at each coordinated value of the timing of the read strobe, sweep the coordinated value of the timing of the write strobe from a minimum value to a maximum value.

7. The processor-implemented method of claim 3, wherein the performing the respective second write-read operation for the third values includes, for one of the third values for which the respective second write-read operation has the read data not match the write data, performing a limited number of at least one additional write-read operation writing write data to a location in the memory and reading read data from the location in the memory until the read data matches the write data.

8. The processor-implemented method of claim 3, wherein the performing the respective second write-read operation for each of the third values includes performing a sequence of the second write-read operations using the third values of the timing of the write strobe, wherein the sequence is one of a sequence of increasing values or a sequence of decreasing values for each second write-read operation of the sequence.

9. The processor-implemented method of claim 8, wherein the sequence of the second write-read operations uses the third values of the timing of the write strobe that are increasing values beginning at a minimum value and ending at one of the third values for which the respective second write-read operation has the read data not match the write data and after another of the third values in the sequence has the respective second write-read operation having the read data match the write data.

10. The processor-implemented method of claim 3, wherein the determining the fourth value includes selecting the fourth value as a middle one of a range of the plurality of third values for which the respective second write-read operation has the read data match the write data.

11. The processor-implemented method of claim 3, wherein the performing the respective third write-read operation for each of the fifth values includes, for one of the fifth values for which the respective third write-read operation has the read data not match the write data, performing a limited number of at least one additional write-read operation writing write data to a location in the memory and reading read data from the location in the memory until the read data matches the write data.

12. The processor-implemented method of claim 3, wherein the performing of the respective third write-read operation for each of the fifth values includes performing a sequence of the third write-read operations using the fifth values for the timing of the read strobe, the sequence being one of a sequence of increasing values or a sequence of decreasing values for each third write-read operation of the sequence.

13. The processor-implemented method of claim 12, wherein the sequence of the third write-read operations uses the fifth values of the timing of the read strobe that are increasing values beginning at a minimum value and ending at one of the fifth values for which the respective third write-read operation has the read data not match the write data and after another of the fifth values in the sequence has the respective third write-read operation having the read data match the write data.

14. The processor-implemented method of claim 3, wherein the determining of the sixth value includes selecting the sixth value as a middle one of a range of the plurality of fifth values for which the respective third write-read operation has the read data match the write data.

15. The processor-implemented method of claim 3, wherein the determining of the fourth value includes determining the fourth value that is a center of a first number of the plurality of third values for which the respective second write-read operation has the read data match the write data, and the determining the sixth value includes determining the sixth value that is a center of a second number of the plurality of fifth values for which the respective third write-read operation has the read data match the write data, the first and second numbers each exceeding a respective threshold.

16. The processor-implemented method of claim 3, wherein the setting of the timing of the write strobe and the timing of the read strobe includes setting a first delay circuit to produce a delay, between write data and a write strobe, specified by the fourth value, and setting a second delay circuit to produce a delay, between the read data and a read strobe, specified by the sixth value.

17. An apparatus for automatic adjustment of a timing of a write and read strobes for a memory, comprising:
  a double data rate (DDR) interface adapted to receive write data and a write strobe and to transmit read data and a read strobe, wherein the DDR interface is adapted to receive the write data relative to a transition of the write strobe and to transmit the read data relative to a transition of the read strobe;
  a first delay circuit coupled to the DDR interface and adapted to produce one of a plurality of delays for the write timing between the write data and the write strobe as specified by a respective one of a plurality of first values of a first parameter;
  a second delay circuit coupled to the DDR interface and adapted to produce one of a plurality of delays for the read timing between the read data and the read strobe as specified by a respective one of a plurality of second values of a second parameter; and
  a processor coupled to the DDR interface and the first and second delay circuits, the processor adapted to execute instructions causing the processor to perform operations including performing a sequence of a plurality of write-read operations, each write-read operation of the sequence including respectively setting the first and second parameters to one of the first values and one of the second values, and writing write data to a location in the memory and subsequently reading read data from the location in the memory, the operations further including determining an operating point from the write-read operations for which the read data matches the write data, and respectively setting the first and second parameters to one of the first values and one of the second values of the operating point.

18. The apparatus of claim 17, wherein the processor is adapted to execute the instructions causing the processor to perform the operations including the performing of the sequence of the write-read operations, the sequence systematically scanning through the first values for the first parameter and the second values for the second parameter.

19. The apparatus of claim 18, wherein the processor is adapted to execute the instructions causing the processor to perform the operations including the performing of the sequence of the write-read operations for all combinations of one of the first values for the first parameter and one of the second values for the second parameter.

20. The apparatus of claim 18, wherein the processor is adapted to execute the instructions causing the processor to perform the operations including the performing of the sequence of the write-read operations, the sequence scanning through the first values for the first parameter for each of the second values for the second parameter until the read data matches the write data for the corresponding write-read operation, and subsequently scanning through the first values for the first parameter at one of the second values for the second parameter and scanning through the second values for the second parameter at one of the first values for the first parameter.

21. The apparatus of claim 17, wherein the processor is adapted to execute the instructions causing the processor to perform the operations including the determining of the operating point at the one of the first values and the one of the second values, the operating point having the one of the first values that is a center of the first values corresponding to the write-read operations at the one of the second values for which the read data matches the write data, and having the one of the second values that is a center of the second values corresponding to the write-read operations at the one of the first values for which the read data matches the write data.

22. A processor-readable device embodied with program storage medium configuring with instructions for automatic adjustment of a timing of a write and read strobes of a double data rate (DDR) interface of a memory, wherein execution of the instructions by one or more processors causes the one or more processors to perform operations including, performing a sequence of a plurality of write-read operations, each write-read operation of the sequence including setting the timing of the write strobe to one of a plurality of first values and the timing of the read strobe to one of a plurality of second values, and writing write data to a location in the memory and subsequently reading read data from the location in the memory, determining an operating point from the write-read operations for which the read data matches the write data, and respectively setting the timing of the write and read strobes to one of the first values and one of the second values of the operating point.

* * * * *